(12) United States Patent
Jung

(10) Patent No.: US 7,498,214 B2
(45) Date of Patent: Mar. 3, 2009

(54) SEMICONDUCTOR DEVICES AND MANUFACTURING METHODS OF THE SAME

(75) Inventor: Myung Jin Jung, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/548,480

(22) Filed: Oct. 11, 2006

(65) Prior Publication Data
US 2007/0087510 A1 Apr. 19, 2007

(30) Foreign Application Priority Data
Oct. 12, 2005 (KR) .............. 10-2005-0095897

(51) Int. Cl.
*H01L 21/336* (2006.01)
*H01L 21/8234* (2006.01)
(52) U.S. Cl. ............ 438/197; 438/752; 438/753; 257/E21.051; 257/E21.115; 257/E21.127; 257/E21.37; 257/E21.304

(58) Field of Classification Search ........... 257/288, 257/192, 213, 200, 401, 510, 347, 622, 616; 438/197, 692, 752, 753
See application file for complete search history.

(56) References Cited

U.S. PATENT DOCUMENTS

| | | | | |
|---|---|---|---|---|
| 6,111,267 A | * | 8/2000 | Fischer et al. | ............ 257/19 |
| 6,492,216 B1 | * | 12/2002 | Yeo et al. | ............ 438/197 |
| 6,846,720 B2 | * | 1/2005 | Balasubramanian et al. | ............ 438/424 |
| 7,300,846 B2 | * | 11/2007 | Jung | ............ 438/285 |
| 2004/0256647 A1 | * | 12/2004 | Lee et al. | ............ 257/289 |
| 2005/0009263 A1 | * | 1/2005 | Yeo et al. | ............ 438/221 |

FOREIGN PATENT DOCUMENTS

CN 1500288 5/2004

* cited by examiner

*Primary Examiner*—David Nhu
(74) *Attorney, Agent, or Firm*—Sherr & Vaughn, PLLC

(57) ABSTRACT

A semiconductor device may include first and second silicon layers formed over a semiconductor substrate. An insulating layer may be formed between first and second silicon layers. A gate insulating layer, a gate electrode, and a spacer may be formed over a second silicon layer. A source/drain impurity area may be formed over a second silicon layer on both sides of a gate electrode.

18 Claims, 5 Drawing Sheets

SEMICONDUCTOR DEVICES AND MANUFACTURING METHODS OF THE SAME

The present application claims priority under 35 U.S.C. 119 and 35 U.S.C. 365 to Korean Patent Application No. 10-2005-0095897 (filed on Oct. 12, 2005), which is hereby incorporated by reference in its entirety.

BACKGROUND OF THE INVENTION

There has been steady development of the semiconductor industry. The semiconductor industry is quantitatively and qualitatively improving to satisfy market and technology demands. Aspects of the semiconductor industry focus on minimization and integration of semiconductor transistors. Minimization and integration of semiconductor transistors may be accomplished by minimizing the size of elements included in semiconductor devices.

As semiconductor devices are fabricated at smaller sizes, larger amounts of devices may be integrated on a single chip. As a result, electrons may be able to pass through the devices more quickly, improving the processing speed of a semiconductor device. Additionally, the number of electrons that pass through a semiconductor may be reduced when the size of a semiconductor device reduces, reducing power consumption.

High integration, high speed, and low power consumption of the semiconductor device generally illustrate the historical performance improvements of semiconductor devices over time. In 1971, a minimum line width of a transistor was 10 µm. However, the minimum line width of the transistor improved to 0.25 µm in 1997 and to 90nm in 2003.

Over the past 30 years, semiconductor devices have improved in terms of size, degree of integration, and chip speed. For example, the size of semiconductor devices has generally reduced by a factor of about 50, the degree of integration has generally increased by a factor of about 10,000, and chip speed has generally improved by a factor of about 1000. Research has been conducted exhibiting a transistor having a line width of about 90 nm. Furthermore, transistors having a line width of about 65 nm are under development.

In 0.13-micron semiconductor manufacturing processes, a gate having a width of approximately 70 nm is formed in a wafer having a size of approximately 200 mm. In 90 nm semiconductor manufacturing processes, a gate having a width of approximately 50 nm can be formed in a wafer having a size of approximately 300 mm. In the future, it may be possible that a gate having a width of approximately 35 nm may be formed in a wafer of at least 300 mm through 65 nm semiconductor manufacturing processes. 90 nm semiconductor manufacturing processing exhibits various advantages compared to 0.13-micron semiconductor manufacturing processing. For example, a 1.2 nm gate oxide layer, a 50 nm gate layer, and a 50 nm strained silicon layer may be manufactured through 90 nm semiconductor manufacturing processing, may produce a high speed and low power consumption transistor. Additionally, since 90 nm semiconductor manufacturing processing may use 300 nm wafers, manufacturing costs may be reduced. It is possible that these developments in semiconductor processing will continue in the future.

One structure of a transistor is a MOSFET (metal oxide silicon field effect transistor) transistor. The basic operation of a transistor is based on a drift-diffusion equation. This basic operating principal has not changed, even as the size of semiconductor devices has been reduced by a factor of at least 50 over time. Accordingly, MOSFET technology fundamentals are projected to remain unchanged during the developing minimization of semiconductor devices. However, there are challenges that MOSFET devices face during fabrication of semiconductor devices having line widths of 0.1 µm or less (e.g. nano-scale semiconductor devices).

Technology for growing strained silicon has developed. When growing strained silicon, a germanium specimen is placed on a silicon substrate and heat may be applied to grow germanium (Ge) from the silicon substrate. Silicon (Si) may then be bonded to germanium (Ge) and heat may be applied to grow strained silicon. The strained silicon may have a grain size substantially the same as germanium (Ge).

The size of a semiconductor device employing strained silicon may be relatively small. However, mobility of electrons and holes may be lowered. Accordingly, there is a need for strained silicon MOSFET devices with adequate mobility of electrons and holes.

During fabrication of strained silicon MOSFET devices, germanium (Ge) may be grown from silicon (Si) such that the interval between silicon atoms is enlarged to correspond to the interval between germanium atoms. Silicon (Si) may then be grown to form strained silicon. The strained silicon may be used to form a strained silicon MOSFET to have a grid structure with spacing larger than that of silicon (Si).

FIG. 1 is an example graph illustrating an increase of electron mobility in a semiconductor device employing strained silicon. The y-axis represents the effective mobility of electrons and an x-axis represents the vertical effective field. A strained silicon semiconductor device, including silicon that is strained using silicon-germanium having about a 15% atom density of germanium (e.g. reference numeral 15), has a higher effective mobility compared to a semiconductor device without strained silicon (e.g. reference numeral 10). Likewise, a semiconductor device with silicon that is strained using silicon-germanium having about a 16% atom density of germanium (see, reference numeral 16), has more effective mobility.

In general, a vertical effective field for a semiconductor device may be in the range of 500 to 600K(V/Cm). For example, a silicon semiconductor device without strained silicon (e.g. represented by reference number 10) may exhibit electron mobility of about 270 $Cm^2/V^0s$. A semiconductor device having strained silicon using silicon-germanium having about 15% atom density of germanium may exhibit electron mobility of about 450 $Cm^2/V^0s$ (e.g. see reference numeral 15). Likewise, a semiconductor device having strained silicon using silicon-germanium having about 16% atom density of germanium may exhibit electron mobility of about 480 $Cm^2/V^0s$ (e.g. see reference numeral 16). Accordingly, when an active silicon layer is strained using a silicon-germanium epitaxial layer having about 16% atom density of germanium, electron mobility may be improved by about 70% or more.

Although semiconductor devices employing strained silicon may improve performance by increasing the mobility of electrons and holes, it cannot reduce DIBL (drain induced barrier lowing). DIBL in nano-scale semiconductor devices may be caused by leakage current and/or junction breakdown voltage.

SUMMARY OF THE INVENTION

Embodiments relate to semiconductor devices and semiconductor device manufacturing methods. In embodiments, an insulating layer is formed at a lower portion of a channel area. An insulating layer, in embodiments, may reduce a channel size and may substantially prevent leakage current, which may allow for the size of a semiconductor device to be reduced. Likewise, an insulating layer, in embodiments, may reduce the junction breakdown voltage and may allow a MOSFET to operate with a higher operational voltage.

In embodiments, a semiconductor device comprises: first and second silicon layers formed on a semiconductor substrate; an insulating layer formed between the first and second silicon layers; a gate insulating layer, a gate electrode and a spacer sequentially formed on the second silicon layer; and a source/drain impurity area formed on the second silicon layer at both sides of the gate electrode.

Embodiments relate to a method of manufacturing a semiconductor device, with the method comprising: forming a first silicon layer on a semiconductor substrate; forming a trench in the first silicon layer; filling the trench with an insulating layer; forming a second silicon layer on the first silicon layer and the insulating layer; and forming a transistor on the second silicon layer.

DETAILED DESCRIPTION

Figure 1:
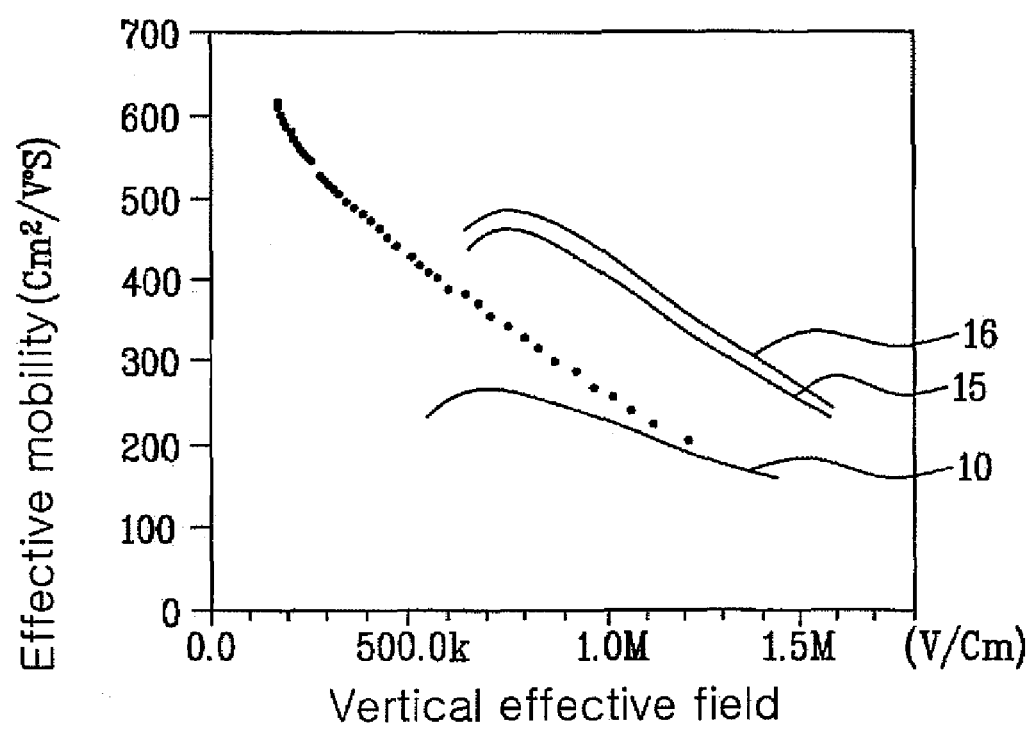
FIG. 1 is an example graph illustrating an increase of electron mobility in a semiconductor device employing strained silicon.
Figure 2:
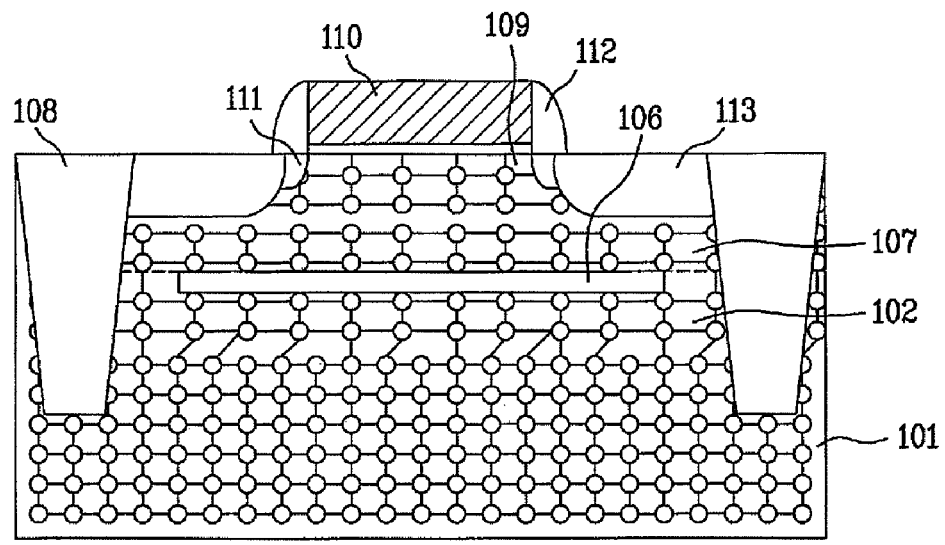
FIG. 2 is an example sectional view of a semiconductor device, in accordance with embodiments.

FIG. 2 is an example sectional view illustrating a semiconductor device in accordance with embodiments. A semiconductor device may include silicon substrate 101 on which an isolation area and an active area are defined. Isolation layer 108 may be formed in an isolation layer of silicon substrate 101. First silicon layer 102 and second silicon layer 107 may be sequentially formed over the silicon substrate 101. Second insulating layer 106 may be formed in the center of an active area between first silicon layer 102 and second silicon layer 107.

Gate electrode 110 may be formed over second silicon layer 107. Gate insulating layer 109 may be formed between gate electrode 110 and second silicon layer 107. Spacer 112 may be formed on the side of gate electrode 110. LDD (lightly doped drain) area 111 and source/drain impurity area 113 may be formed over second silicon layer 107 on both sides of gate electrode 110. During processing, second insulating layer 106 may be formed in a trench having a predetermined depth, in accordance with embodiments. Second insulating layer 106 may be formed in first silicon layer 102. Second insulating layer 106 may include an oxide layer and/or a nitride layer.

Figure 3A:
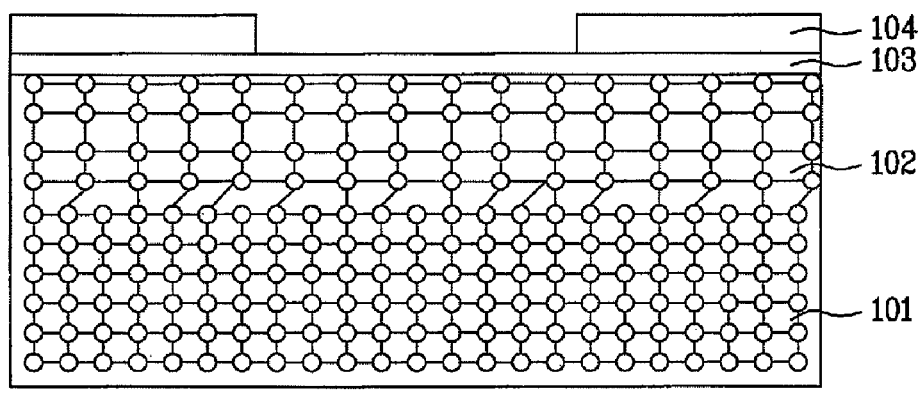
FIGS. 3A to 3F are example sectional views illustrating an example processes of manufacturing semiconductor devices and example structures of semiconductor devices, in accordance with embodiments.

FIGS. 3A to 3F are example sectional views illustrating a process of manufacturing semiconductor devices, according to embodiments. As illustrated in FIG. 3A, a germanium specimen may be grown from silicon substrate 101 through an epitaxial process to form first silicon layer 102. First insulating layer 103 (e.g. including an oxide layer and/or a nitride layer) may be formed over first silicon layer 102. Photoresist layer 104 may be formed over first insulating layer 103. Through processing (e.g. an exposure and development process) photoresist layer 104 may be selectively patterned.

In embodiments, first insulating layer 103 may be omitted. Photoresist layer 104 may be directly formed over first silicon layer 102 and may then be patterned.

Figure 3B:
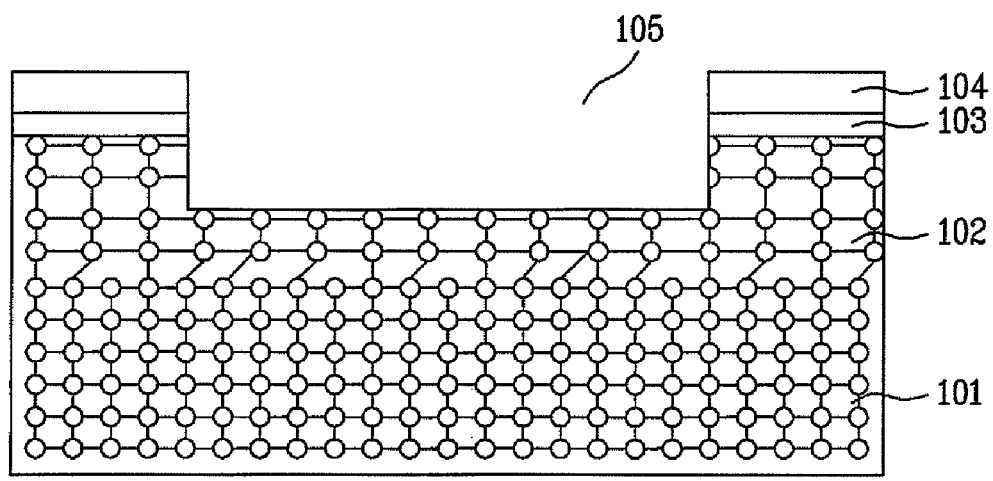

As illustrated in FIG. 3B, first insulating layer 103 and first silicon layer 102 may be selectively etched using photoresist layer 104 to form trench 105. Photoresist layer 104 may have a mask pattern as a mask. Trench 105 may have a predetermined depth into first silicon layer 102.

Figure 3C:
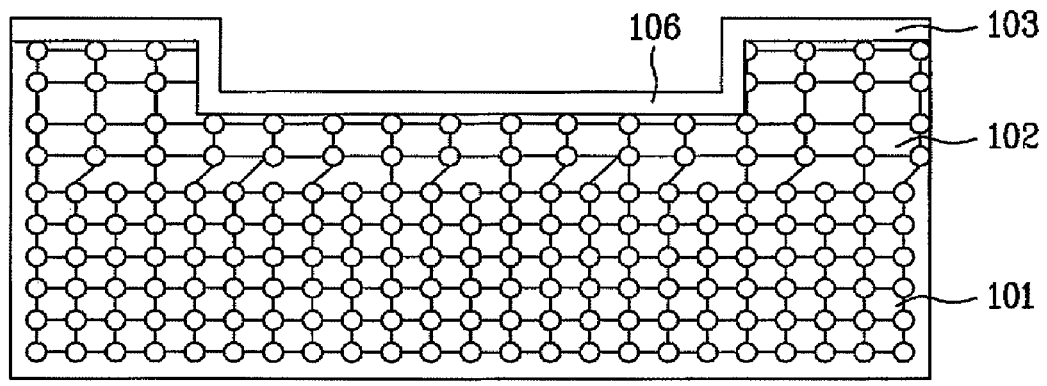

As illustrated in FIG. 3C, after removing photoresist layer 104 and first insulating layer 103, second insulating layer 106 may be formed over the entire surface of silicon substrate 101 including trench 105.

Figure 3D:
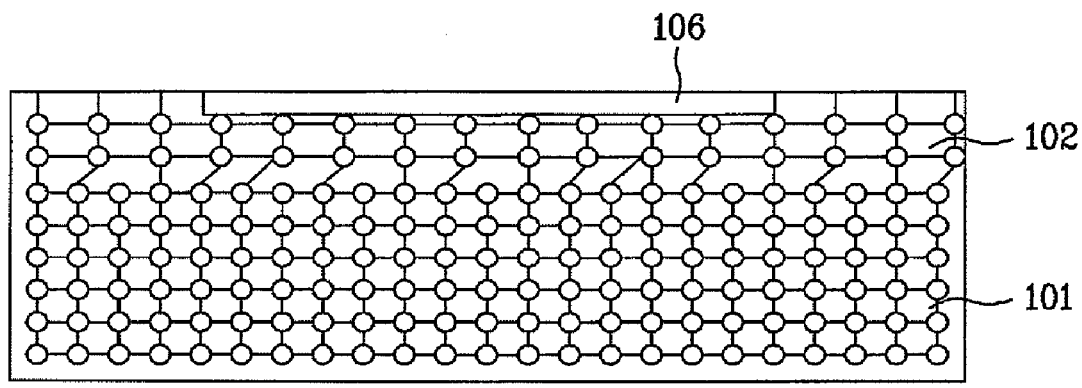

As illustrated in FIG. 3D, a chemical mechanical polishing process may be performed on the entire surface of second insulating layer 106 and first silicon layer 102 until the surface of the second insulating layer 106 formed in the trench 105 is an exterior surface. In embodiments, the surface of first silicon layer 102 and second insulating layer 106 are coplanar.

Figure 3E:
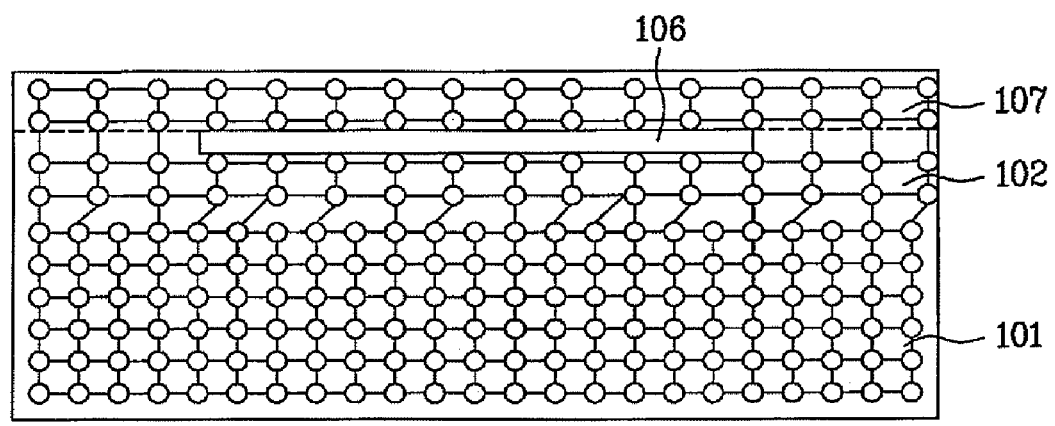

As illustrated in FIG. 3E, an epitaxial process may be performed on silicon substrate 101 to form second silicon layer 107 over first silicon layer 102 and second insulating layer 106.

Figure 3F:
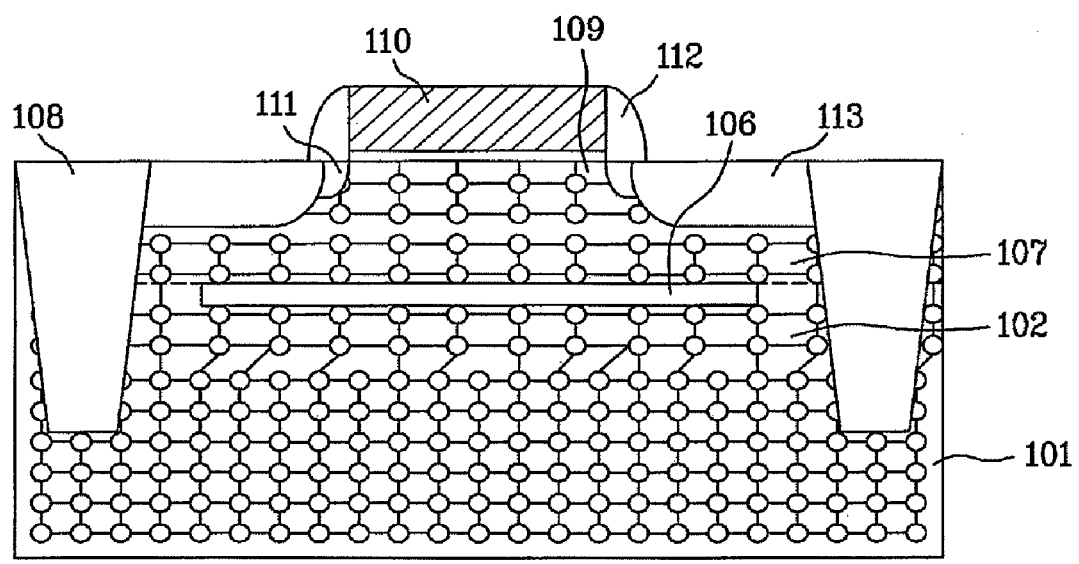

As illustrated in FIG. 3F, at least one photolithography process may be selectively performed on silicon substrate 101, which may include second silicon layer 107. At least one photolithographic process may be performed to selectively remove second silicon layer 107, first silicon layer 102, and silicon substrate 101 to form a trench. The trench may filled with insulating material to form isolation layer 108. Isolation layer 108 may have a shallow trench isolation (STI) structure.

Gate insulating layer 109 and a poly-silicon layer may be formed to form a gate electrode. Gate insulating layer 109 and a poly-silicon layer may be sequentially formed on the entire surface of the silicon substrate 101. A poly-silicon layer and gate insulating layer 109 may be selectively removed (e.g. through a photolithography process) to form gate electrode 110 on a predetermined portion of second silicon layer 107.

Low-density n type or p type dopants may be implanted into silicon substrate 101 (e.g. using gate electrode 110 as a mask). LDD area 111 may be formed on second silicon layer 107 on both sides of gate electrode 110.

An insulating layer may be deposited on the entire surface of silicon substrate 101 (e.g. including gate electrode 110). An etch back process may be performed on the entire surface of silicon substrate 101 to form spacer 112 at the lateral portion of gate electrode 110.

High-density n type or p type dopants may be implanted into the entire surface of silicon substrate 101. Gate electrode 110 and spacer 112 may serve as a mask. Source/drain impurity area 113 may be formed on second silicon layer 107 on both sides of gate electrode 110. Halo ions can be implanted into silicon substrate 101 at a predetermined angle (e.g. by using gate electrode 110 as a mask).

In embodiments, mobility of electrons and holes may be improved in a nano-scale (or small in embodiments) semiconductor device. In embodiments, insulating layer may be formed at the lower portion of the channel area (e.g. between source/drain impurity areas), which may reduce leakage current. Leakage current may be a problem in strained silicon MOSFETs that results in DIBL (drain induced barrier lowing).

In embodiments, insulating layer may be formed at the lower portion of the channel area (e.g. between source/drain impurity areas), which may reduce junction breakdown voltage. Junction breakdown voltage may be caused by high levels of leakage current.

In embodiments, a semiconductor device may have improved data storage characteristics while preventing degradation of semiconductor devices caused by high leakage current in ULSI (ultra-large scale integration) and SOI (silicon on insulator) MOSFETs.

It will be apparent to those skilled in the art that various modifications and variations can be made to embodiments. Thus, it is intended that embodiments cover modifications and variations thereof within the scope of the appended claims.

What is claimed is:

1. A semiconductor device comprising:
    a first strained silicon layer and a second strained silicon layer formed over a semiconductor substrate;
    a first insulating layer formed between the first strained silicon layer and the second strained silicon layer;
    a gate insulating layer, a gate electrode, and a spacer sequentially formed over the second strained silicon layer; and
    a source/drain impurity area formed in the second strained silicon layer on both sides of the gate electrode.

2. The semiconductor device of claim 1, wherein the first and second strained silicon have grid spacing different from unstrained silicon.

3. The semiconductor device of claim 1, wherein the first strained silicon layer comprises silicon that is strained using germanium.

4. The semiconductor device of claim 1, wherein the first insulating layer comprises an oxide layer.

5. The semiconductor device of claim 1, wherein the first insulating layer comprises a nitride layer.

6. The semiconductor device of claim 1, wherein the first insulating layer is formed below the gate electrode.

7. The semiconductor device of claim 1, wherein the first insulating layer is formed in a trench and the trench is formed in the first strained silicon layer.

8. A method for manufacturing a semiconductor device comprising:
    forming a first strained silicon layer over a semiconductor substrate;
    forming a trench in the first strained silicon layer;
    forming a first insulating layer over the trench;
    forming a second strained silicon layer over the first strained silicon layer and over the first insulating layer; and
    forming a gate insulating layer and a pate electrode over the second strained silicon layer;
    forming a lightly doped drain area in the second strained silicon layer by implanting dopants;
    forming a spacer on both sides of the gate electrode; and
    forming a source/drain area by implanting dopants.

9. The method of claim 8, wherein the first strained silicon layer is formed by growing germanium on the semiconductor substrate through an epitaxial process.

10. The method of claim 8, wherein said forming the first insulating layer comprises:
    forming the first insulating layer over the first strained silicon layer having the trench; and
    performing a chemical mechanical polishing process on the first strained silicon layer and the first insulating layer.

11. The method of claim 8, wherein the first and second strained silicon layers comprise strained silicon having grid spacing different from unstrained silicon.

12. The method of claim 8, wherein the first strained silicon layer comprises silicon that is strained using germanium.

13. The method of claim 8, wherein the first insulating layer comprises an oxide layer.

14. The method of claim 8, wherein the first insulating layer comprises a nitride layer.

15. The method of claim 8, wherein the first insulating layer is formed below the gate electrode.

16. The method of claim 8, wherein the second strained silicon layer directly contacts the first strained silicon layer and the first insulating layer.

17. The semiconductor device of claim 1, wherein the second strained silicon layer directly contacts the first strained silicon layer and the first insulating layer.

18. The semiconductor device of claim 1, wherein the first insulating layer is coplanar with the first strained silicon layer.

* * * * *